(12) United States Patent
Kundert (10) Patent No.: US 7,574,342 B2
(45) Date of Patent: Aug. 11, 2009

(54) METHODS OF MODEL COMPILATION FOR MODELS USED IN AN ELECTRONIC CIRCUIT SIMULATOR

(75) Inventor: Kenneth S. Kundert, Los Altos, CA (US)

(73) Assignee: Cadence Design Systems, Inc., San Jose, CA (US)

( * ) Notice: Subject to any disclaimer, the term of this patent is extended or adjusted under 35 U.S.C. 154(b) by 0 days.

(21) Appl. No.: 11/255,903

(22) Filed: Oct. 21, 2005
(Under 37 CFR 1.47)

(65) Prior Publication Data

US 2006/0248518 A1  Nov. 2, 2006

Related U.S. Application Data

(63) Continuation of application No. 10/965,311, filed on Oct. 20, 2004, now abandoned.

(51) Int. Cl.
*G06F 17/50* (2006.01)
(52) U.S. Cl. ...................................................... 703/13
(58) Field of Classification Search .................. 703/13, 703/14, 16
See application file for complete search history.

(56) References Cited

U.S. PATENT DOCUMENTS

| | | | | |
|---|---|---|---|---|
| 5,963,724 A * | 10/1999 | Mantooth et al. | ............. | 703/14 |
| 5,995,733 A * | 11/1999 | Roychowdhury | ............. | 716/6 |
| 7,035,782 B2 * | 4/2006 | Yang et al. | ..................... | 703/14 |
| 2002/0016704 A1* | 2/2002 | Blanks | ........................ | 703/14 |
| 2005/0149313 A1* | 7/2005 | Roesner et al. | ............... | 703/22 |

OTHER PUBLICATIONS

Intusoft, 1988-1996, IsSPICE4 User's Guide, pp. 1-418.*
Telichevesky et al., Efficient Steady-State Analysis based on Matrix-Free Krylov-Subspace Methods. 1995. IEEE. pp. 480-484.*
L. Lemaitre, C. McAndrew and S. Hamm, "ADMS-Automatic Device Model Synthesizer," IEEE 2002 Custom Integrated Circuit conference, May 2002, p. 27-30.
Justin E. Harlow III, "A Gentle Introduction to Compact Model Compilers," 2002, p. 1-6.
Ken Kundert, "paramset: A Verilog-A/MS Implementation of Spice .model Statements," The Designer's Guide Community, Version 5, Dec. 2004, p. 1-17.
Ken Kundert, "Proposed Verilog-A Language Extensions for Compact Modeling," Version 9, Aug. 13, 2004, p. 1-23.
Kundert, Kenneth S., "Circuit Simulation," Chapter 1 of The Designer's Guide to SPICE & SPECTRE, Kluwer Academic Publishers, Norwell, Massachusetts, 1995, pp. 1-14.

* cited by examiner

*Primary Examiner*—Kidest Bahta
*Assistant Examiner*—Eunhee Kim
(74) *Attorney, Agent, or Firm*—Stephen C. Durant; Duane Morris LLP (57) ABSTRACT

A method is provided for compiling a model for use in a simulation, the method comprising receiving a description of the model; and automatically converting the description into an implementation of the model that is customized for a selected analysis during simulation.

10 Claims, 5 Drawing Sheets

METHODS OF MODEL COMPILATION FOR MODELS USED IN AN ELECTRONIC CIRCUIT SIMULATOR

FIELD OF THE INVENTION

The invention relates generally to computer simulation of systems, and more particularly, to models used in simulators.

BACKGROUND OF THE INVENTION

Description of the Related Art

Simulation Overview

A simulator is a computer software program used to analyze a system based upon a description of the system. Basically, a simulator permits a user to ask questions about the system by performing analyses during simulated operation of the system. A simulator numerically computes a response of a system to simulated stimuli. In general, a simulator applies various stimuli to an executable system model in order to predict how the system will respond. Simulation allows one to understand how complex systems behave before one incurs the time and expense of actually implementing the system. Typically, a system description comprises equations that describe the behavior of the system. The simulator solves these equations in the context simulated conditions represented by the stimuli in order to simulate operation of the system under those conditions. For a more thorough discussion of simulators, see Ken Kundert, *The Designer's Guide to SPICE and Spectre*, Kluwer Academic Publishers, 1995.

A circuit simulator typically constructs circuit equations from mathematical models of the components contained in the circuit. The models may be built-in, as is generally the case for semiconductor models in SPICE-like simulators, or they may be specified by the user using some type of modeling language such as Verilog-AMS, which is one of many different hardware description languages (HDLs). A circuit simulator typically constructs a set of ordinary differential equations to describe a circuit to be simulated. The equations are constructed from parameterized models of circuit components along with circuit connectivity information provided in a netlist. Given an initial condition and a stimulus, the equations are solved for the response of the circuit. More specifically, to form the equations, the simulator combines mathematical models of individual components with equations that describe how the components are interconnected. The interconnection equations are derived from Kirchoff's voltage and current laws. The KCL states that the sum of all currents flowing out of a node at any instant is zero. The KVL states that the algebraic sum of all branch voltages around a loop at any instant is zero.

Thus, circuit simulators such as SPICE take a description of a circuit and simulate it so as to predict its real world behavior. The circuit description usually consists of a netlist, which is a list of components with additional information that describes how the components should be connected to each other. The circuit description also includes values for the parameters for the various circuit components. The circuit description also includes detailed models for individual circuit components in the form of a collection of equations that relate their interface quantities. Moreover, the circuit description ordinarily includes general rules on how to combine the interface quantities when components are interconnected. In the past, circuit simulators have provided both of these things as built-in capabilities. The component models are generally written in a programming language such as C and compiled into the simulator. The interconnection rules are based on Kirchhoff's Laws and are hard-coded into the simulator.

Though this approach has served the electronics industry well for over thirty years, it is problematic in several ways. The following are examples of the types of problems that can arise using this approach. First, with models being compiled into the simulators, they are black boxes to end users. Often, extensive documentation is needed for the users to be able to understand the models, and often, because of the complexity of the models, the documentation does not match the model as implemented. Second, users have minimal or no control over the models; they often must accept what they are given. This is problematic for users who need to use simulators from different vendors, because the models may not match between the various simulators. Third, the process of updating or modifying a model can be arduous and very slow. It may involve many different parties, all of whom must agree with the updates and then must act to implement the updates, and many of these parties may not directly benefit from the updates.

For these reasons and others, there has been trend away from writing models in general purpose programming languages like C, and instead using special purpose modeling languages, such as Verilog-A. To this end, the Verilog-A language is currently being enhanced to better support compact modeling. It is expected that both the implementation and maintenance of models will be much easier when models are written in Verilog-A than if they were implemented in C. In addition, models written in Verilog-A will be much easier to understand, so much so that it is expected that the end users will be able to enhance and maintain them themselves. To allow this, simulators will soon be outfitted with "model compilers" that will allow users to convert models written in Verilog-A into an implementation of the model that is linked into the simulator. In many cases, the Verilog-A model will first be translated into a general purpose programming language such as C or C++, and then the resulting code compiled and linked into the simulator. Already, model compilers are starting to appear. See, for example, Lemaitre, L., McAndrew, C., Hamm, S., ADMS-Automatic Device Model Synthesizer, IEEE 2002 Custom Integrated Circuit Conference, May, 2002 p. 27-30. Compilers based on a standardized Verilog-A language are likely to largely replace existing compilers that are based on non-standard language.

More specifically, when implementing models for circuit simulators, the goal typically has been to provide an implementation that is efficient in terms of the time and memory that is required when executing within the simulator, and efficient in terms of the time it takes to implement the model in C. It will be appreciated that, although C programming language has been used most often to implement models in the past, other programming languages such as, C++ and Fortran also have been used. Of particular concern are the parameters of the model. A modern MOS model like BSIM3 may have hundreds of parameters. Storing individual copies of each of these parameters for each instance of the model would be prohibitively expensive; so SPICE partitions the parameters into instance parameters and model parameters.

Instance parameters, which are usually small in number, could be specified on each instance of the model, and so each instance would require storage for these parameters. Instance parameters usually convey geometry information. The remaining parameters, the model parameters, are generally used to describe the fabrication process; and so would be shared between a large number of instances. As such, model parameters often are specified as a distinct group using a .model statement. Then, the instances would each reference a single .model statement. In this way, a single copy of the .model parameters can be shared between many instances, which can reduce memory requirements. By careful implementation of the .model, any calculations that only involved .model parameters, and perhaps global environmental parameters such as temperature, could be performed once for each set of .model parameters and the results stored with the .model parameters.

Figure 1:
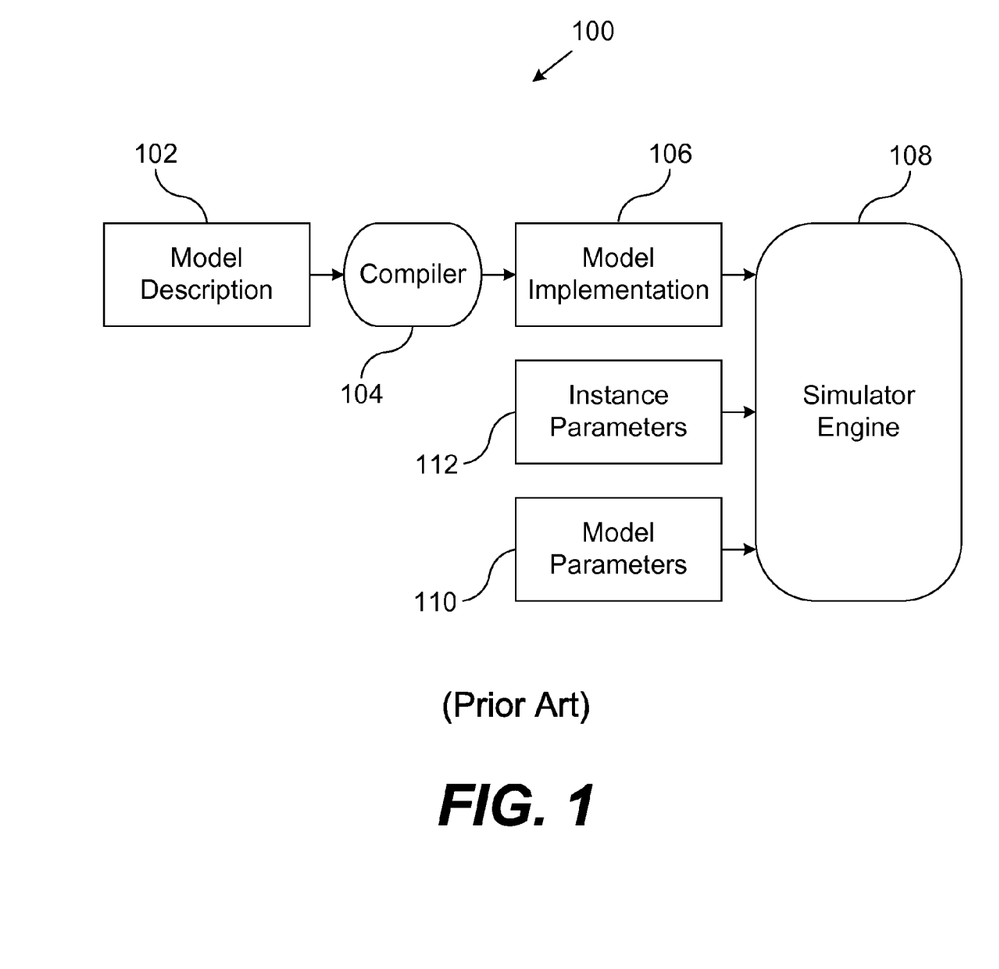
FIG. 1 is an illustrative flow diagram showing a traditional approach to conversion of a model description to an implementation suitable for a target simulator and to combination of the implementation with instance parameters and model parameters within the simulator.

FIG. 1 is an illustrative flow diagram representing a traditional method 100 of using component models with a simulator. A model description 102, which may be described in a language such a C or in a HDL such as Verilog-A, for example, is provided to a compiler 104, which is a computer program that converts the model description 102 into a model implementation 106. The model implementation 106 is provided to the simulator engine 108 together with separately specified model parameters 110 and instance parameters 112.

In general, the characteristics of this earlier approach to model implementation are that there is a description for each model, and that description is customized with two types of parameters: instance parameters, which are unique to each instance, and model parameters, which are shared between multiple instances; and that the description is compiled into a single implementation, and that implementation is combined with the instance and model parameters within the simulator.

The complexities of simulation and the role of component models will be better appreciated from the following explanation of selected simulator characteristics.

Analyses During Simulation

An analysis as used herein is a process used by a simulator to predict the behavior of a system under a given set of conditions or assumptions. One type of system that can be analyzed through simulation is a circuit which comprises a plurality of individual components. Simulation may be employed to perform many different types of analysis such as transient analysis, DC analysis, AC analysis, harmonic balance analysis, Monte Carlo analysis, mismatch analysis and parametric analysis, and corners analysis to name just a few examples.

Transient analysis computes the response of a system as a function of time. Transient analysis typically involves a system of nonlinear ordinary differential equations. There is no known method to directly solve these equations. The approach used in a circuit simulator, for example, is to discretize time, which converts the problem from the solution of a single system of nonlinear differential equations into that of solving a sequence of systems of nonlinear algebraic equations. Replacing the time derivative operator with a discrete-time approximation and solving the resulting finite-difference equations one time point at a time starting from some initial condition is called numerically integrating the differential equation. There are four integration methods commonly used in circuit simulation, for example, forward Euler, backward Euler, trapezoidal rule and backward difference formulas (also known as Gear's methods).

DC analysis typically is used to compute operating points of a system. In general, operating points are simply snapshots of some solution trajectory. In DC analysis, the operating points are also assumed to be equilibrium points. Equilibrium points are constant-valued operating points. In other words, equilibrium points are solutions that do not change in time. A circuit, for example, cannot reach an equilibrium point if the stimulus is still changing, so the first step in a DC analysis is to configure the independent sources so they are constant. In addition, all waveforms are constant-valued at equilibrium points, $dv/dt=0$ and $di/dt=0$ and so capacitors act as open circuits and inductors act as short circuits. Thus, the basic approach to computing an equilibrium point involves configuring all independent stimulus sources to be constant-valued; replacing all capacitors with open circuits; and replacing all inductors with short circuits. Solving the equations that describe the resulting system gives an equilibrium point. The system of equations are nonlinear and algebraic (no time derivatives or integrals). Newtons's method is a well known approach to solving large nonlinear systems of algebraic equations. Newton's method is an iterative process that continues until some criterion for stopping is satisfied.

AC analysis generally involves driving a system, such as a circuit, with 'small' sinusoidal signals, and calculating a steady-state or eventual solution. Since the stimulus is small, the circuit can be linearized and all resulting signals will be sinusoids. AC analysis is an efficient way to compute transfer functions that does not have the accuracy problems associated with transient analysis or the convergence problems of DC analysis.

Harmonic balance analysis formulates the circuit equations in the frequency domain, meaning that the solution is written as a Fourier Series $$v(t) = \sum_k V_k e^{jk\omega t}$$

with the solution given in terms of the Fourier coefficients $V_k$ rather than in terms of the waveform $V(t)$. This is relatively easily done for the linear components, there is a direct mapping between the models in the time domain and in the frequency domain, but more troublesome for the nonlinear components. So typically with harmonic balance, the nonlinear component models are evaluated in the time domain and the results converted back into the frequency domain so that they can be combined with the results from the linear components. In a transient analysis the solution waveform is built up one point at a time, and so the models are evaluated only at one point at a time, but with harmonic balance, the model can be evaluated over the entire waveform at once.

Monte Carlo is a meta-analysis, meaning that it is an analysis that runs other analyses. During Monte Carlo analysis, a user identifies a collection of variables in a system; and the simulator selects random values for those variables and simulates the system using the randomly selected variables. The simulator continues the cycle of selecting random values followed by simulation using the selected values so as to develop a statistical 'picture' that represents the system dependence upon the values selected for the identified variables.

Mismatch analysis is similar to Monte Carlo analysis, except that the identified variables are for things that should be matched. Parametric analysis typically involves identifying a parameter, and sweeping it across a range of values in the course of simulation. For example, the parameter might be temperature, which might be swept from freezing to boiling in the course of multiple simulation cycles.

Algorithms During Simulation

An algorithm as used herein is a particular procedure used by a simulator to implement an analysis. Algorithms used in SPICE define what we shall refer to as a traditional approach to simulation. This approach is referred to as a direct method of simulation. In the direct method for simulation, the nonlinear ordinary differential equations that describe a system are first formulated and then converted to a system of difference equations by a multistep integration method such as the trapezoidal rule. The nonlinear difference equations are solved using the Newton-Raphson algorithm, which generates a sequence of linear equations that are solved using sparse Gaussian elimination.

Explicit integration and relaxation methods are examples of two alternative algorithmic approaches. An explicit integration method such as forward Euler eliminates the need to actually solve the large system of differential equations that describe a system. Instead, a solution at a particular time is extrapolated from a solution at a previous time. In the context of a circuit simulation, it is assumed that there are no floating capacitors and that there is at least one capacitor that connecting every node in the circuit to ground. The extrapolation is performed by evaluating circuit equations (not solving them) to determine the current into the grounded capacitors.

Relaxation methods exploit latency in a system by breaking it into smaller components and solving each piece independently. If signals in one or more pieces are latent, then it is not necessary to solve for them. In the context of a circuit simulation, the waveform relaxation methods take this approach one step further. Circuits are partitioned into subcircuits, but the subcircuits are solved independently over time rather than for a single point in time. This allows the simulator to exploit multirate behavior as well as latency. Multi-rate behavior is where the signals in subcircuits are changing, but where the signals in one are changing more slowly than the signals in another. In that case, the simulator is free to choose larger time steps in the subcircuit whose signals are changing more slowly.

Component Modeling for Simulation

A traditional circuit simulator such as SPICE provides a relatively limited set of built-in models, those needed to model components commonly available on integrated circuits. There is relatively limited ability to add new models. These earlier simulators generally offer end users only the ability to add components described by a small number of simple formulas. These prior simulators interpret the models, and therefore, execute relatively slowly. Unfortunately, this approach to simulation generally is not well suited for complicated models or those that are heavily used.

Verilog-AMS is an example of an HDL that has features that can be used to efficiently describe a broad range of models. Examples include basic components such as resistors, capacitors, and inductors. Additional examples include semiconductor components such as diodes, BJTs, MOSFETs and varactors. Public domain Verilog-A models exist for virtually all commonly used compact models such as Gummel-Poon, VBIC, Mextram BJT models and the MOS3, BSIM3&4 and EKV MOS models. HDL models also exist for functional blocks such as data converters, de/modulators, samplers and filters and for logic components such as gates, latches and registers, for example. Moreover, there are HDL models for multi-disciplinary components such as sensors, actuators and transducers, for example. For a more complete discussion of Verilog-AMS, see, Ken Kundert and Olaf Zinke, *The Designer's Guide to Verliog-AMS*, Kluwer Academic Publishers, 2004.

The ability to add models to a circuit simulator such as SPICE dramatically increases its range and can make it immensely more powerful. Through a variety of different models, a simulator can be used to simulate a broad variety of different types of systems. For instance, the ability to add models for laser and photodiodes can make a simulator suitable for simulation of electro-optical systems. The ability to add magnetic and power semiconductor models can make a system suitable for simulation of power systems. In general, appropriate models can make a simulator suitable for simulation of mechanical, thermal, acoustic or fluidic systems, for example.

To a device technologist, a device model generally signifies a set of equations that indicate charge carrier distributions as a function of device structure, process parameters, temperature and time. To a circuit designer, a device model often signifies a 'compact model' that abstracts away much of the technical detail and behaviorally models I-V characteristics. A compact model is implemented as statements in a programming language. To implement any SPICE model including BSIM, a designer ordinarily should have a detailed understanding of the simulator including the sequence of calls it uses to communicate with the model. The program statements typically are tailored to the Application Programming Interface (API) of a simulator of interest. See, Justin E. Harlow, *A Gentle Introduction to Compact Model Compilers*, 2002.

Models that are written in an industry standard HDL such as Verilog-AMS (a superset of Verilog and Verilog-A) or VHDL-AMS (a superset of VHDL), are more portable. Moreover, models written in an HDL source form are more easily accessible to users for correction of flaws or for enhancement. As a result, there has been increasing interest in writing models using HDLs instead of in system level languages such as C or C++, for example.

Compiling Compact Models to Specific Target Simulators

A compact model compiler translates model statements from an HDL to an intermediate data structure. Next, the intermediate data structure is translated to a form suitable for use with a simulator. An advantage of this approach is that the process of targeting a model to different simulators with different APIs is simplified because the targeting proceeds from the intermediate representation rather than from the model equations See, Justin E. Harlow, Supra.

One example of a model compiler is the Automated Device Model Synthesizer (ADMS) which takes as input a Verilog-A description of a model and produces C code that compiles directly into a simulator. ADMS is structured with a front-end that compiles Verilog-A into an intermediate representation and with a back-end that converts the intermediate representation into C code that compiles directly into a target simulator. ADMS can provide different back-ends for different simulators such as, for Spectre, ADS, McSpice and NanoSim. Thus, the same model can be easily compiled into different simulators. See, Laurant Lemaitre, et al., Supra.

SUMMARY OF THE INVENTION

An aspect of the invention provides for the automatic compilation of a model for use in a simulation. The method involves receiving a description of a model and automatically converting the description into an implementation of the model that is customized according to one or more selected customization criteria. The customization criteria may include, for example, one or more of parameter values, an analysis and/or an algorithm to be run during simulation, model partitioning, model structural topology or model connectivity or model feature removal.

Model compilation in accordance with an aspect of the invention automatically customizes model implementations for particular simulation needs so as to optimize simulation performance through model optimization. In essence, a model implementation is customized to a simulation rather than to a simulator. Thus, unlike prior compact model compilers, for instance, which produced intermediate implementations that were then re-targeted to different simulators, an embodiment of the present invention compiles a model tailored to a simulation to be performed by a simulator. That is, whether that implementation is in an executable form targeted to a particular simulator or in an intermediate form is not relevant to the practice of the present invention.

These and other features and advantages of the present invention will become apparent from the following detailed description of embodiments thereof in conjunction with the drawings.

DETAILED DESCRIPTION OF THE PREFERRED EMBODIMENTS

Overview

The present invention provides a novel method and apparatus for customization of component models for use during simulation. The following description is presented to enable any person skilled in the art to make and use the invention. The embodiments of the invention are described in the context of particular applications and their requirements. These descriptions of specific applications are provided only as examples. Various modifications to the preferred embodiments will be readily apparent to those skilled in the art, and the generic principles defined herein may be applied to other embodiments and applications without departing from the spirit and scope of the invention. Thus, the present invention is not intended to be limited to the embodiments shown, but is to be accorded the widest scope consistent with the principles and features disclosed herein.

The present invention can improve simulator performance by providing models that are customized or tailored to the particular simulation. Simulator performance can be measured or assessed or evaluated based upon factors such as faster execution time or reduced memory requirements. Basically, a simulation can run more efficiently with improved performance if the model is matched to the simulation. It will be appreciated that the invention involves a new approach in which a model is customized for a simulation, rather than for a simulator API as was the case for prior compact model compilers.

An aspect of one embodiment of the invention is automatic customization or tailoring of a model based upon one or more parameter values applicable to a simulation. An aspect of another embodiment of the invention is automatic customization or tailoring of a model based upon criteria such as one or more analyses or one or more algorithms or one or more partitions to be used in a simulation. An aspect of yet another embodiment of the invention is the automatic pre-compiling of multiple different versions of a model based upon simulation-based criteria such as one or more parameter values applicable to the simulation or one or more possible analyses or one or more possible algorithms or one or more possible partitioning applicable to a simulation. At simulation time, one or more pre-compiled models may be selected for use in the simulation.

For example, according to this new approach, a single model can be represented by one or more descriptions, and these descriptions can be combined with multiple sets of model parameters by the compiler to produce multiple implementations. Furthermore, even if a single description and single set of model parameters were given, multiple implementations of the model may be generated by the compiler that are optimized for particular situations. In particular, for example, versions can be compiled that are optimized for special circumstances. It would be possible, for example, to have a version of a MOS model with parasitic resistors and one without; a version with the source and bulk shorted and one without; a version for n-type devices and one for p-type devices; one with the capacitors (for transient) and one without (for DC); etc.

Besides creating multiple implementations that are more heavily optimized than the single implementation of the traditional approach, this new approach also provides the benefit that the partition between instance and model parameters need not be hard coded. In other words, the model description may just identify that it has a set of parameters. The model parameters then become any parameters whose values are specified at compilation time, and the instance parameters are those whose values were not specified.

Model Customization for Parameters

Figure 2:
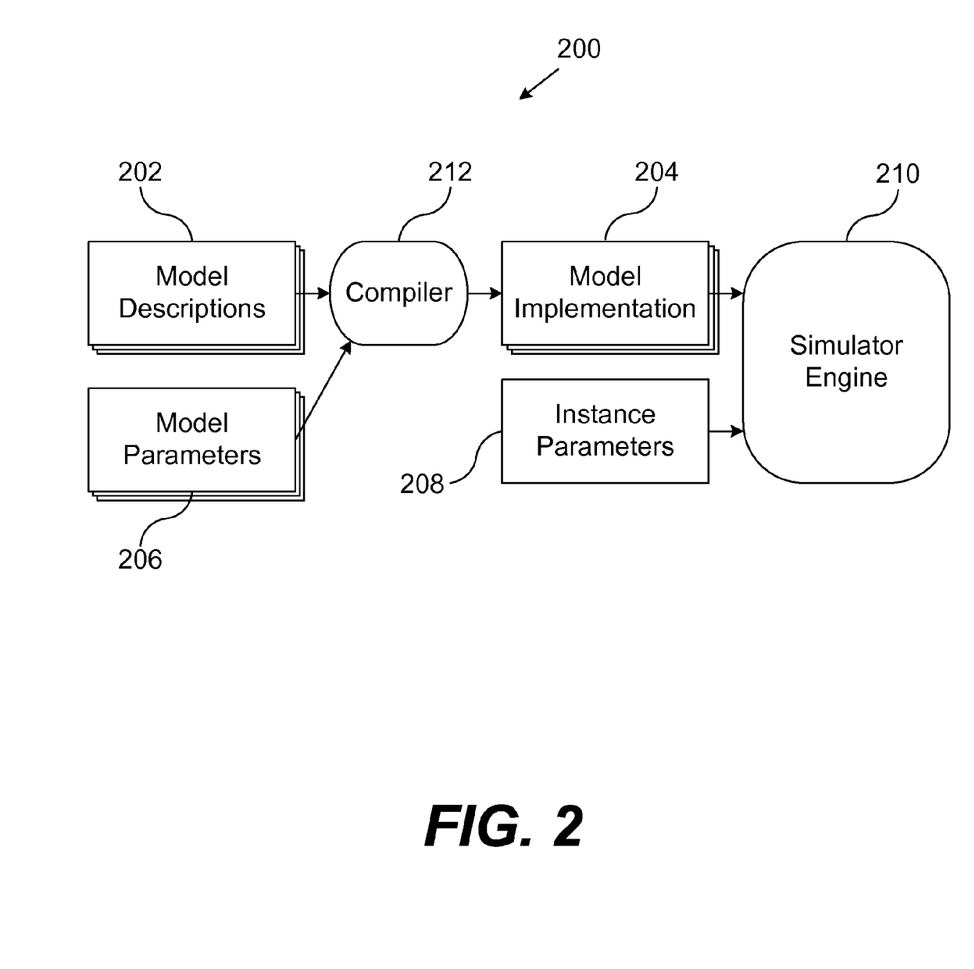
FIG. 2 is an illustrative flow diagram showing an approach to conversion of one or more model descriptions to one or more model implementations based upon one or more parameters and to provision of such model implementations together with other parameters to a simulator engine in accordance with an embodiment of the invention.

FIG. 2 is an illustrative flow diagram 200 showing a process to convert one or more model descriptions 202 to one or more model implementations 204 based upon one or more model parameters 206 and to provision of such model implementations 204 together with instance parameters 208 to a simulator engine 210 in accordance with an embodiment of the invention. Basically, one or more model description 204 are customized or specialized based upon the model parameters 206. Specifically, the one or more model descriptions 202 and the model parameters 206 are provided to a compiler 212, which is a computer program that converts the model descriptions 202 to model implementations 204 that are specialized for the specified model parameters. That is, model parameters 206 are complied into the one or more model implementations 204. Each implementation 204 can be provided to the simulator engine 210 together with instance parameters 208 that are combined with the provided implementation 204 within the simulator. This novel approach can lead to improved simulation performance because there is no need to carry parameters in memory (better cache performance); models are partially pre-evaluated, eliminating any terms that are solely dependent on values that are specified as model parameters; and code that is made unnecessary by the particular choices of model parameters can be eliminated, along for the test that is used to determine whether that code should be executed), for example.

Figure 3:
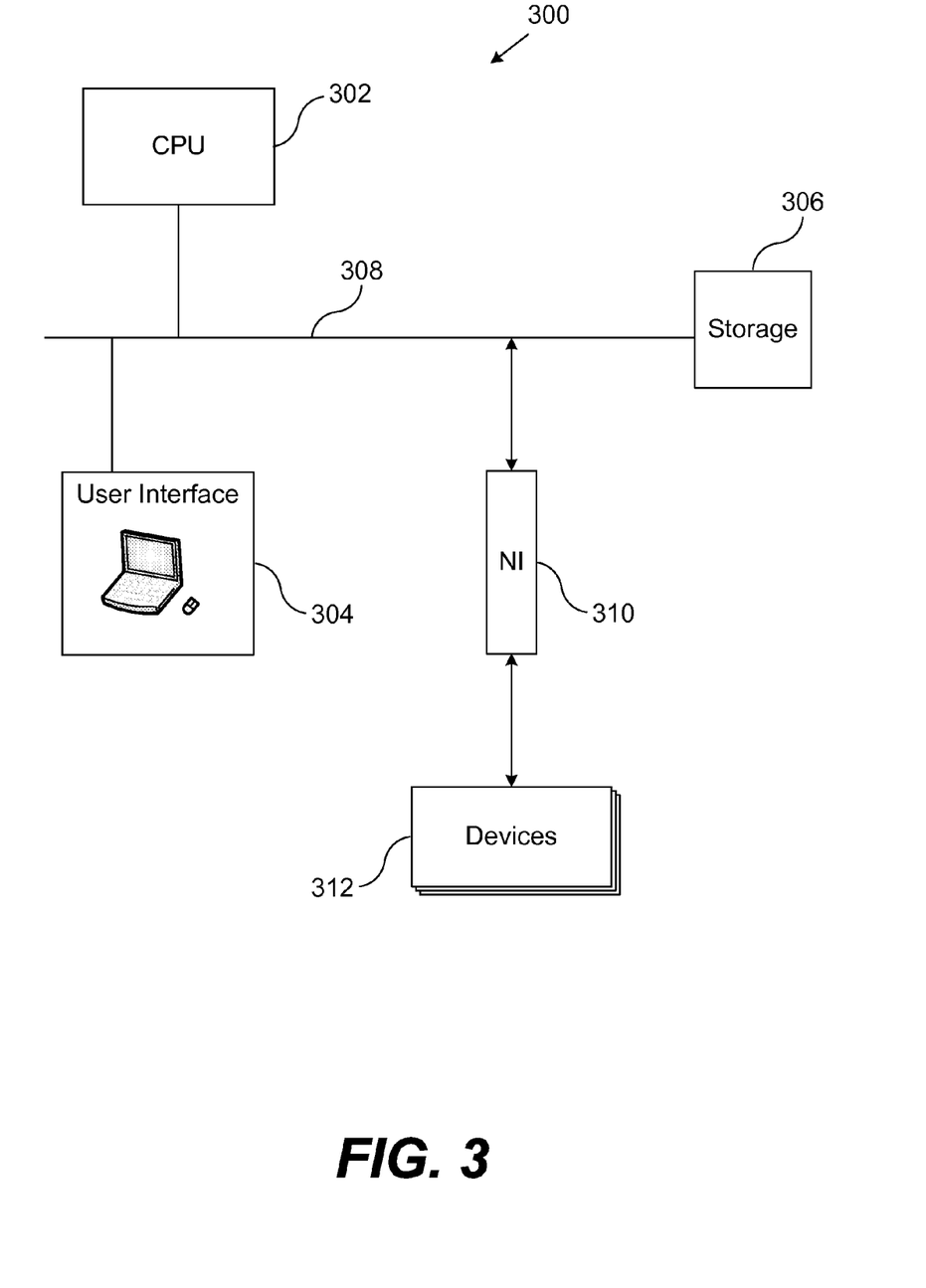
FIG. 3 is a schematic diagram of an illustrative computer system in which processes in accordance with embodiments of the invention may operate; the computer system includes or may communicate with a computer readable media that may be encoded with computer programs and model implementations in accordance with embodiments of the invention.

FIG. 3 is a schematic drawing of an illustrative computer system 300 that can run a novel compiler in accordance with an embodiment of the invention. The computer system 300 includes one or more central processing units (CPU's) 302, a user interface 304, computer readable storage media 306, a system bus 308, and one or more bus interfaces for connecting the CPU, user interface, memory and system bus together. The computer system also includes a network interface 310 for communicating with other devices 312 on a computer network.

Computer readable model descriptions may be provided, via bus 308, from interface 304, storage 308 or other devices 312, to a compiler running from storage 308 on the CPU 302. Similarly, parameter values and/or customization criteria may be provided to the compiler. The compiler converts the model descriptions into model implementations based upon the parameter values and/or customization criteria.

As used herein, an implementation is a specialization of the model in either a programming language such as C or in machine language that has been optimized to run more efficiently. It will be appreciated that the implementation may be an executable form targeted to a particular simulator engine or it may be an intermediate form that is suited for re-targeting to any of several different simulator engines. In essence, in the course of converting, a description of one or more models to one or more model implementations, the compiler also automatically specializes or customizes the model based upon customization criteria such as model parameters values or based upon analyses or on algorithms, or on combinations thereof, for example. As used herein converting may include one or more of, substituting known values into the model equations; pre-evaluating model equations (identify and pre-evaluate any sub-expressions that involve only known constants); performing code optimization (common subexpression elimination, eliminating code that would never be used, etc.) to maximize speed of execution; targeting implementation for particular analyses if appropriate by eliminating any formulas for values that are not needed by the analysis (for example, charge and capacitance during DC analysis); targeting implementation for particular algorithms for example, eliminate derivative calculations when using Samanskii's rule); partitioning model if appropriate.

More specifically, in accordance with an embodiment of the invention, the model parameters may be specified as a set of explicit values, or a set of formulas that can be used to compute the value of the parameters from other quantities or as a combination of both. In particular, for example, such other quantities may be other model parameters, instance parameters, new user defined instance parameters, or simulator variables or parameters. Consider each in turn. First assume a model description that defines four parameters, $\alpha$, $\beta$, $\lambda$ and $\delta$. Now assume that a model parameter specification includes, $\alpha=1$ $\beta=2^*\alpha$ $\delta\lambda+1$ with no value or formula being specified for $\lambda$. Then $\alpha$ and $\beta$ become model parameters that take the constant values 1 and 2 and that these become constants during the compilation phase, meaning that their values are fixed and they cannot be overridden in the compiled model. Parameter $\lambda$ becomes an instance parameter and so its value can be passed into the compiled model. Finally, $\delta$ is compiled away and replaced by $\lambda+1$. In this way, a model description that started with four parameters is converted to an implementation parameter with only one after compilation with a particular set of three model parameter values.

For more flexibility, when specifying the model parameters, it is possible to specify new instance parameters and make the model parameters a function of those. For example, assume that the above model is compiled with a parameter set that declares a new parameter $\epsilon$, and specifies the model parameters as $\alpha=\epsilon$ $\beta=2^*\alpha$ $\lambda=\epsilon/2$ $\delta=\lambda+1$ The resulting implementation would have one parameter, $\epsilon$, that was not amongst the parameters of the original model, and the four parameters of the original model description would be given values that are a function of $\epsilon$. Simulator performance would be improved because of reduced memory requirements. In this case, there would be a need to store only $\epsilon$, rather than to store each of $\alpha$, $\beta$, $\chi$, and $\delta$.

Moreover, it is possible for the model parameter sets to specify the value of model parameters in terms of global simulator values. This capability might be used to scale parameters, as in the case of the SPICE multiplicity factor, or the global simulator values might be random variables that are used during a Monte Carlo analysis. As a further example, consider the above model description except make $\epsilon$ not a parameter of the model parameter set, but a global random variable. The resulting compiled model would be very similar to the one from the last case, except that the value of $\epsilon$ would not be specified directly by the user as an instance parameter, but instead would be taken as the value of the random variable $\epsilon$.

Thus, in one aspect of this embodiment of the invention, the compiler compiles model parameters into the model implementation. That is, the compiler treats the parameters as constants that will not change during the simulation; it then performs code optimizations. For example, consider the model of a resistor given by $$i = \frac{w}{lR_{sh}}v$$

where w is width, l is length, and $R_{sh}$ is the sheet resistance of the material from which the resistor is constructed. Assume that at compile time the value of w, l, and $R_{sh}$ are known to be 1 µm, 100 µm, and 1 kΩ. Then the model can be simplified to $i=10^{-5}$ v. In another aspect of this embodiment of the invention, the compiler actually partitions at least some parameters into one subset of parameters that are compiled into the implementation and another subset that are not. The compiler uses criteria such as is the availability of the parameter value available or hints from the user to determine which parameters to partition into the implementation and which to leave as instance parameters separate form the implementation.

It should be noted that proposed Verilog-A and Verilog-A/ MS extensions do not distinguish between instance parameters and model parameters per se. See, for example, paramset: A Verilog-A/MS Implementation of SPICE .model Statements, Version 4, Feb. 10, 2004; and Proposed Verilog-A Language Extensions for Compact Modeling, Version 7, Apr. 2, 2004. Although a distinction between instance parameters and model parameters was drawn in certain prior simulation environments, principles of the invention apply even in the absence of such distinctions. In particular, even with parameters that may not be specified as either instance or model parameters under these proposed language extensions, the compiler still may compile away certain parameters and still may partition parameters to be complied away from those that are not to be compiled away.

Customization Based Upon Other Customization Criteria

Figure 4:
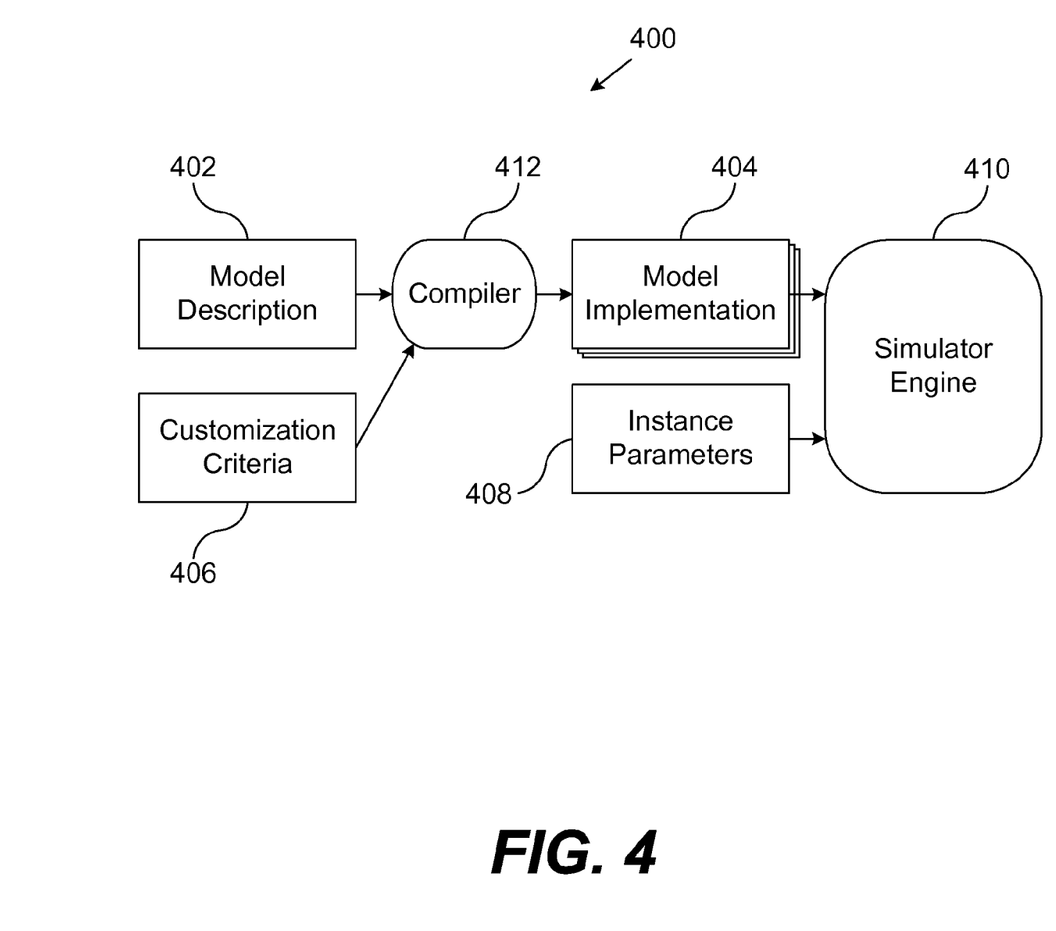
FIG. 4 is an illustrative flow diagram showing an approach to conversion of one or more model descriptions to one or more implementations based upon customization criteria, in which a compiler receives a model description and also receives customization criteria, and in which the compiler automatically converts the model description into a customized model implementation in accordance with the criteria.

FIG. 4 is an illustrative flow diagram 400 showing a method to convert of one or more model descriptions 402 to one or more implementations 404 based upon customization or tailoring criteria 406 in accordance with an embodiment of the invention. The implementation 404, together with instance parameters 408, then may be provided to a simulation engine 410. Basically, a compiler 412 receives a model description 402 in a language such as Verilog-A, for example. The compiler 412 also receives the customization criteria 406. The compiler 412 which may run on a computer system like that of FIG. 3, automatically converts the high level model description into a customized model implementation in accordance with the criteria. In essence, the computer system is programmed to convert a high level model description to an implementation that is specialized based upon specialization criteria. That is, the compiler customizes an implementation differently according to the one or more specialization criteria it receives.

The implementation 404 may be an executable implementation targeted to a particular simulation engine or it may be an intermediate implementation. The customization criteria may relate to one or more analyses or algorithms to be performed during simulation. The customization also may be based upon partitioning for simulation, parallel processing during simulation, feature removal, support algorithm removal, component connection specifics or changes to be made in a model's structural topology, to name a few examples.

Customization for Analysis

The analysis to be performed by a simulator is one customization criterion in accordance with an embodiment of the invention. An analysis is a process used to predict behavior of a circuit under a given set of assumptions or conditions. A typical simulator may be directed to perform any of multiple different forms of analysis such as transient analysis, DC analysis, AC analysis, harmonic balance analysis, Monte Carlo analysis, mismatch analysis and parametric analysis, to name just a few examples. Often, simulator performance for a given model can be improved by customizing that model for the particular analysis to be performed. Thus, some portions of a model may be more important to certain analyses and may be less important for others. In accordance with one aspect of the invention models can be specialized according to the analyses they are to be used with during simulation.

For DC analysis, for example, simulator performance can be improved by converting a high level (e.g. HDL) description of a model into an implementation of the model that includes only the static (resistive) portion of the model. Simulation Performance during DC analysis can be improved since conventional approaches would either evaluate the unneeded dynamic (capacitance or inductance) part and then discard it, or place it in a series of 'if' statements, the condition of each would have to be evaluated every time the model was evaluated. This is usually a smaller effort than evaluation of the dynamic part of the model, but it is not always negligible.

Basically, a compiler running on a computer system, in accordance with an embodiment of the invention, receives an indication that a model is to be customized for DC analysis. The compiler automatically converts the model description, which is in a computer readable medium, into an implementation that is customized for DC analysis. The compiler stores the customized implementation in computer readable medium from which it can be accessed by a simulator.

For AC analysis, for example, simulator performance can be improved by converting a high level (e.g. HDL) description of a model into an implementation of the model that includes only the derivative terms (resistance, conductance, capacitance, inductance). In one embodiment, a novel compiler running on a computer system converts the model to an implementation that includes only derivative terms. The implementation is placed in computer readable media for use by the simulator. Simulation performance can be improved because computation of unneeded quantities such as current, charge, and flux can be avoided.

For simulation involving a transient analysis, for example, both the static (resistive) and dynamic (capacitive) portions of the model are required during simulation. Performance is improved by eliminating the conditionals that determine whether each piece of the model is needed. That is, in one embodiment, a compiler running on the computer system converts the model to an implementation that does not include these unnecessary conditions. In other words, conventional art generally writes an "evaluation" function for a model that is used for all analyses. This prior code computes more that is needed for the simpler analyses such as AC and DC at considerable extra expense. So conditions are often added to the prior code to determine if these simpler analyses are being run, and the unneeded parts of the model are skipped. However, evaluation of these conditions by prior code adds cost for transient analysis because all of those conditions are be evaluated even though they provide no savings.

For simulation involving harmonic balance analysis, for example, simulator performance can be improved by converting a model description into an implementation of the model that evaluates the model over an entire waveform rather than at a single point in time. In one embodiment, a novel compiler running on the computer system converts the model to an implementation that evaluates the model over an entire waveform. In contrast, during transient analysis the simulator evaluates all models at one point in time, and then moves to the next point. In a harmonic balance simulator, however, it is possible to evaluate a single model at all points before moving to the next model. Doing so provides better cache performance by increasing locality of reference. Alternatively, for example, the high level model description may be converted so as to partition between frequency and time domains.

For simulation involving Monte Carlo analysis, for example, simulator performance can be improved by converting a model description into an implementation of the model that the random variables would be taken to be instance parameters; typically, in conventional art the random variables are treated as model parameters and so a complete set of model parameters is needed for each instance even though only the random variables are changing from instance to instance. Accordingly, in one embodiment, the compiler running on the computer system converts the model to an implementation in which certain model parameters are taken as instance parameters.

Monte Carlo analysis may be used to assess the impact of variations in instance parameter values, for example. Parameter values may vary in some statistical manner, and a series of simulations may be run to perform a Monte Carlo analysis to evaluate the impact of such statistical parameter value variation. For example the electrical characteristics of a semiconductor transistor may vary due to variations in an instance parameter value such as oxide thickness or such as undercut.

Similarly, for simulation involving mismatch analysis, for example, simulator performance can be improved by converting a model description into an implementation of the model that are taken to be instance parameters.

Likewise, for simulation involving parametric analysis, for example, simulator performance can be improved by converting a model description into an implementation of the model that are taken to be instance parameters.

Finally, for example, simulation involving corners analysis, which varies a set of parameters over their worst case corners. In this analysis there may be hundreds of parameters that are varying, which would be expensive to vary individually, so only selected 'corner cases' are considered, such as slowest performance or fastest performance. In the first (slower) case, a parameter values are set to result in minimum speed and the second (faster) case parameter values are set to produce maximum speed. Simulation performance can be improved by creating one implementation per corner. Accordingly, in one embodiment, a compiler running on a computer system converts a high-level description of a model into one implementation per corner.

Customization for Algorithms

The algorithm to be performed during simulation is another customization criterion in accordance with an embodiment of the invention. An algorithm is a particular procedure for implementing an analysis. A typical simulator may be directed to perform any of multiple different algorithms such as Samanski's rule, Newton's method, a relaxation method, a Kyrlov method or a numerical integration method, for example. There are several possible numerical integration methods such as, forward or backward Euler, trapezoidal rule, backward difference formulas and Runge Kutta, to name a few examples. Often, simulator performance for a given model can be improved by customizing that model for the particular algorithm to be performed.

For Samanski's rule, for example, simulator performance can be improved by converting a high level description (e.g. HDL) of a model into an implementation of the model that does not include derivatives. Samanski's method does not use the derivatives, so calculating them can be a largely wasted effort. In some situations, for example, up to half the model evaluation time or even more can be just for the derivatives. Samanski's method typically is employed during DC and transient analyses. Accordingly, in one embodiment, a novel compiler converts a high level model description into an implementation that omits derivatives in order to customize a model for Samanski's rule.

For Newton's method, for example, simulator performance can be improved by converting a HDL of a model into an implementation of the model that do include derivatives. If one implementation supports both Samanskii and Newton, then either you just compute the derivatives, which is optimal for Newton but not for Samanskii, or you put in tests to remove them, which is non optimal for either (the tests are additional overhead). If you have two implementations, one for each, each can be optimal. Newton's method typically is employed during DC and transient analyses.

For a relaxation method, for example, simulator performance can be improved by converting a high level description (e.g. HDL) of a model into an implementation of the model that is partitioned, with each partition being evaluated at different times. In one embodiment, a compiler running on a novel compiler connects a high level model description into an implementation that is partitioned so that different partitions can be partitioned at different times. If the model spans two partitions, then each partition would only need to evaluate part of the model. For example, a MOSFET is often divided so that its gate is in one partition, and its channel is in another. Multiple implementations of the model could be created such that one consisted only of the gate model and the other only the channel model. Thus when evaluating a partition, only that part of the model that affects the partition need be evaluated. The relaxation method typically is employed during transient analysis, particularly on large circuits where speed is more of a concern than accuracy.

For a Krylov method, for example, simulator performance can be improved by converting a high level description (e.g. HDL) of a model into an implementation of the model that performs its part of the matrix-vector product computation. Accordingly, in one embodiment, a novel compiler converts a high-level model description into an implementation that performs its own part of the matrix-vector product computation. Traditionally, typically all models are evaluated, and then the matrix-vector products are computed for the entire circuit. Instead, each model may take on the computation of its part of the matrix-vector product. This could improve cache performance, meaning that simulation would be faster because the part of the matrix-vector product contributed by the models would already be in cache and so the time required for fetching it from main memory is avoided. The relaxation method typically is employed during performance of RF analysis such as harmonic balance and shooting methods.

For a numerical integration method, for example, simulator performance can be improved by converting a high level description (e.g. HDL) of a model into an implementation of the model that performs its part of the finite-difference approximation to any time-derivatives. Traditionally, those calculations are typically performed after all models have been evaluated. But in this case, the implementation can take on this job, which would likely improve performance because it can perform the approximations while the data is still in cache memory. A numerical integration method typically is employed during transient analysis. Accordingly, in one embodiment of the invention, a novel compiler converts a model description to an implementation that performs its own approximation.

Customization for Partitioning

Partitioning can be used to decompose a large behavioral description of a design into several smaller ones. Partitioning in the context of computer-aided design is the task of clustering objects into groups so that a given objective function can be optimized with respect to a set of design constraints.

Partitioning a model for simulation is another customization criterion in accordance with an embodiment of the invention. For some simulations, simulator performance can be improved by converting a high level description (e.g. HDL) of a model into a partitioned implementation of the model. With partitioning (as with relaxation), a model may span multiple partitions. As such, when a particular partition is evaluated, only the portion of the model need be evaluated. Relaxation based timing is an example of a particular class of simulator that uses partitioning, relaxation and approximation models to achieve increases in simulation speed. For example, Naasada's HSIM and Cadence's UltraSim use partitioning to increase simulation speed. There are advantages to compiling partitioned implementations of a model, rather than having the simulator do the partitioning. For example, typically, when a simulator partitions a circuit, and component models will then end up spanning partitions. However, when evaluating one partition, there is no need to evaluate that part of a model that is in another partition. Partitioning a model saves simulation effort only on that part of a model that needs to be simulated is simulated. In the past, models have been partitioned by hand, but that is low labor-intensive and error prone work. Accordingly, in one embodiment of the invention, a novel compiler running on a computer system converts a high-level model description into partitioned implementations.

Customization for Parallel Evaluation

In some situations, simulator performance can be improved by converting a HDL of a model into an implementation of the model that is suited for parallel evaluation during simulation. The assumption is that the simulation engine will run on multiple processors. Accordingly, in one embodiment, a novel compiler partitions the implementation so that the partitions can be evaluated simultaneously on separate processors, or to provide implementations that allow the instances of models to be evaluated simultaneously on separate processors. Basically, the compiler runs a dependency analysis on the model's code to determine what it depends on, with the intent of putting each independent code stream in a different thread for evaluation on separate processors.

Customization Through Feature Removal

In one embodiment, a novel compiler converts a description to an implementation that omits features specified to serve as customization criteria. Features include capacitors or inductors for DC analysis or homotopy parameters where not needed for the model simulation. If the feature removal is done on a per analysis basis, then customization for feature analysis may be simulated to customization for AC analysis or for DC analysis, for example. However, if customization may be done for all analyses. For example, homotopy parameters are features that may simply be removed on a particular simulator. And it may happen that one simulator may support very few analyses, and so what looks like customization for an analysis on one simulator that provides much analysis would look like feature removal on another which supports very few analyses.

Customization Through Support Algorithm Removal

Customization through support algorithm removal involves removal of algorithms relating to tolerance checking or numerical integration, for example. Some simulators keep the support algorithms separate from the models, which can decrease performance due to reduced cache effectiveness. A specialized implementation can build these algorithms in on those implementations where they are needed. Conversely, some simulators build the support algorithms into the model. This increases cache effectiveness, but in some cases (some algorithms, some analyses, etc.) these support algorithms are not needed. In this case the fact that the support algorithms are built into the model reduces speed because they are there being evaluated all the time. Two specialized implementations could be built, one with the support algorithm, and one without. Thus the optimal one could be used as appropriate. Accordingly, in one embodiment, the compiler converts a model description to an implementation that omits support algorithms specified through customization criteria.

Customization Through Way in which Model Component is Connected

Customization may be achieved in terms of the way in which a model is connected such as terminals connected together or to ground, for example. Alternatively, a model can be simplified (e.g. variable may be eliminated), resulting in faster execution. Accordingly, in one embodiment, a compiler running on a computer system converts a model to an implementation with corrections and simplifications specified by customization criteria.

Customization Through Change in Model's Structural Topology

Customization may be achieved in terms of changes in structural topology such as removing a parasitic resistor or support nodes from a model, for example. The change in structural topology may be implemented in order to gain simulation speed by jettisoning expensive parts of the model that are not expected to have significant impact. It may be that the decision to do so is based on examining the circuit or at the direction of the end user. Accordingly, in one embodiment, the compiler converts a model to an implementation with a structural topology specified through customization criteria.

Production of Multiple Different Pre-Compiled Implementations

It will be appreciated that the principles of the invention can be achieved by automatically pre-compiling a plurality of customized model implementations based upon different parameters values as described with reference to FIG. 2 or based upon other customization criteria as described in relation to FIG. 4. Thus, in one embodiment of the invention, a plurality of pre-compiled model implementations can be created, and a user or a simulation engine (through a compiler directive for example) may specify which of the pre-compiled model implementations to use in a simulation.

Example of Conversion of a HDL Model Description to Different Model Implementations The following explanation contains an example of multiple implementations for a particular model description. A junction diode model is used as an illustrative example.

Junction Diode

Figure 5:
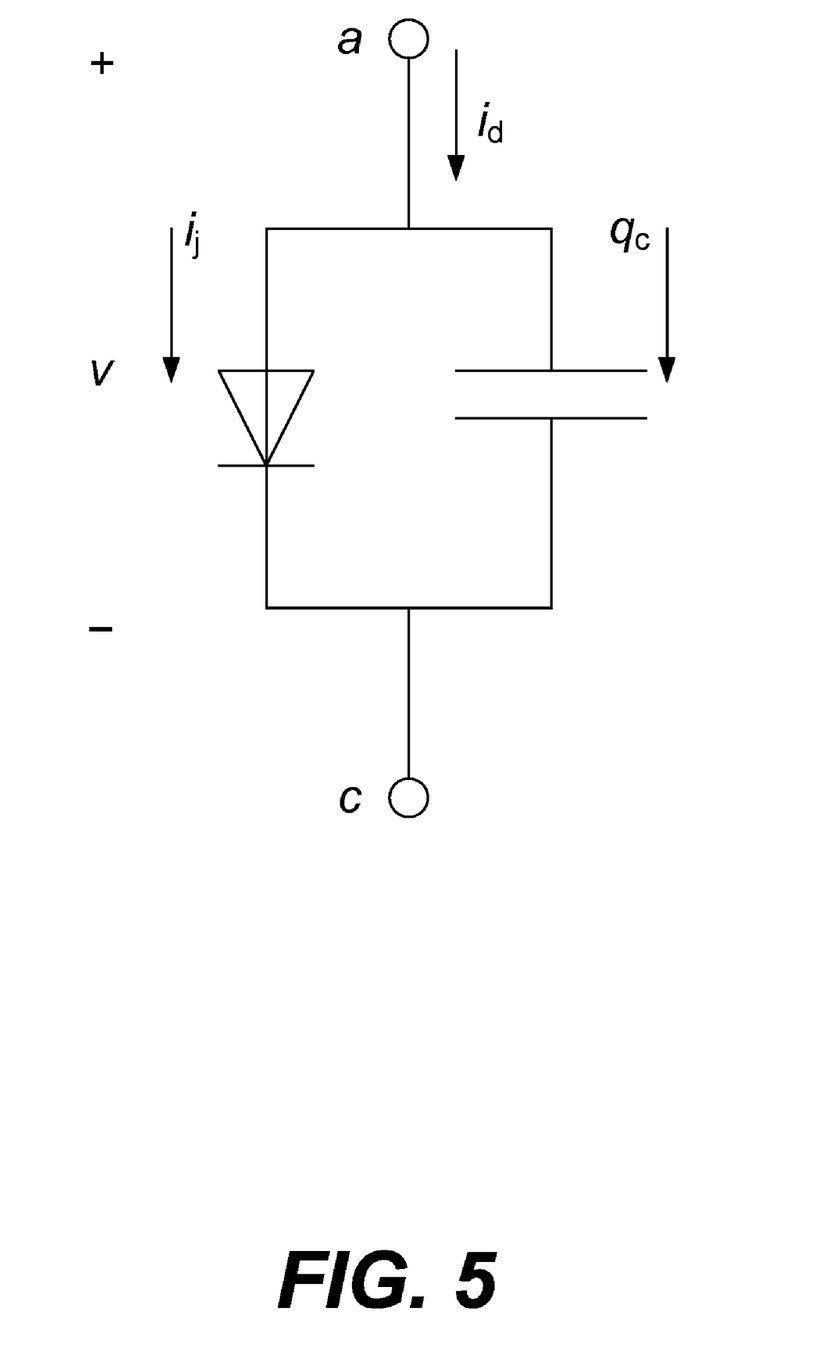
FIG. 5 is an illustrative circuit diagram pictorially representing a model of model of a junction diode.

FIG. 5 is an illustrative circuit diagram pictorially representing a model of a junction diode.

An ideal diode is a component that allows current to flow in one direction but not in the other. A junction diode is a component that can be made using a semiconductor process that approximates this behavior. It is a nonlinear electrical component with the following characteristics, $$i_j = I_s(e^{v/v_T} - 1), \qquad (1)$$

$$C_j = \frac{C_{j0}}{\sqrt{1 - \frac{v}{\phi}}}. \qquad (2)$$

$$C_d = \tau g_d \text{ where } g_d = \frac{di_j}{dv} = \frac{I_s}{V_T}e^{v/v_T} \approx \frac{i_j}{V_T}, \text{ and} \qquad (3)$$

$$C_t = C_j + \frac{dq_c}{dt}. \qquad (4)$$

To implement the model in Verilog-A/MS it should be formulated as constitutive relations in terms of branch potentials and flows. This is already the case for the resistive portion of the model, (1), but not for the capacitive part, (4). To avoid the charge conservation problems the constitutive relationship of the nonlinear capacitor must be formulated in terms of charge and voltage. To do so, the capacitance of (4) is integrated with respect to voltage to find the charge, $$q = \tau_f i_j - 2C_{j0}\phi\sqrt{1 - \frac{v}{\phi}}. \tag{5}$$

Then the total diode current results from combining (1) and (5), $$i_d = i_j + \frac{dq_c}{dt}. \tag{6}$$

The Verilog-A/MS model that implements these equations is given in Listing 1.

---

LISTING 1

---

Verilog-A/MS model for a junction diode (this model should not be used in practice as it fails when v > SYMBOL HERE
//Junction diode
'include "disciplines.vams"
module diode (a, c);
    parameter real is=10f from (0:inf);    //saturation current (A)
    parameter real tf=0 from [0:inf);    //forward transit time (s)
    parameter real cjo=0 from [0:inf);    //zero-bias junction capacitance (F)
    parameter real phi=0.7 exclude 0;    //built-in junction potential (V)
    inout a, c;
    electrical a, c;
    branch (a, c) res, cap;
    real qd;
    analog begin
        I(res) <+ is*(limexp(V(res)/$vt) − 1);
        qd = tf*I(res) − 2*cjo*phi*sqrt(1 − V(cap)/phi);
        I(cap) <+ ddt(qd);
    end
endmodule

---

DC Analysis Customization of Junction Diode Model

In DC analysis, there is no need for the capacitive part of the model. However, one does need the current from the resistive part of the model, and its derivatives. So an implementation tailored for DC analysis would likely provide, $$i_j = I_s(e^{v/v_T} - 1) \text{ and} \tag{7}$$

$$\frac{di_j}{dv} = \frac{I_s}{V_T}e^{v/v_T} \approx \frac{i_j}{V_T} \text{ and} \tag{8}$$

In this DC analysis customized implementation, equations that calculate qd and I(cap) are never evaluated, nor are the associated derivatives, meaning that the model evaluates about twice as fast as it would otherwise.

AC Analysis Customization of Junction Diode Model

In AC analysis, there is no need for current and charge, but the simulator must have the derivatives of the current and charge with respect to voltage. So an implementation tailored for AC analysis would likely provide $$\frac{di_j}{dv} = \frac{I_s}{V_T}e^{v/v_T} \approx \frac{i_j}{V_T} \text{ and} \tag{9}$$

$$\frac{dq_c}{dv} = C_j + C_d = \frac{C_{j0}}{\sqrt{1 - \frac{v}{\phi}}}. \tag{10}$$

In this AC analysis customized implementation, derivatives dI(res)/dV(res) and dI(cap)/dV(cap) are computed, but not I(res) and I(cap) themselves. This results in about a 2× speed up on the model evaluation.

Transient Analysis

In transient analysis the simulator must have the current, the charge, and the derivatives of the current and charge with respect to voltage. So an implementation tailored for transient analysis would likely provide $$i_j = I_s(e^{v/v_T} - 1), \tag{11}$$

$$q_c = \tau_f i_j - 2C_{j0}\phi\sqrt{1 - \frac{v}{\phi}}, \tag{12}$$

$$\frac{di_j}{dv} = \frac{I_s}{V_T}e^{v/v_T} \approx \frac{i_j}{V_T} \text{ and} \tag{13}$$

$$\frac{dq_c}{dv} = C_j + C_d = \frac{C_{j0}}{\sqrt{1 + \frac{v}{\phi}}} + \tau\frac{di_j}{dv}. \tag{14}$$

In this transient analysis, customized implementation, all terms are evaluated, and there are no conditionals to determine whether a term should be evaluated, so the model runs a little faster than if the conditionals are present.

3.4 Samanski's Method

If Samanski's Method is applied for either DC or transient analysis, one does not need the derivatives. So within transient analysis the implementation would likely provide $$i_j = I_s(e^{v/v_T} - 1) \text{ and} \tag{15}$$

$$q_c = \tau_f i_j - 2C_{j0}\phi\sqrt{1 - \frac{v}{\phi}}. \tag{16}$$

Within a DC analysis, only (16) would be provided.

In this Samanski's algorithm customized implementation, derivatives dI(res)/dV(res) and DI(cap)/dV(cap) are computed, but not I(res) and I(cap) themselves. This results in about a 2× speed up in the model evaluation.

Numerical Integration Methods

Numerical integration methods in transient analysis convert a time-derivative in the model into a discrete-time approximation. The Backward Euler method uses the following approximation:

$$\frac{dx(t_k)}{dt} = \frac{x(t_k) - x(t_{k-1})}{t_k - t_{k-1}}. \tag{17}$$

An implementation tailored for a particular numerical integration method would likely provide the following $$i_j(v_k) = I_s(e^{v_k/v_T} - 1) + \frac{1}{t_k - t_{k-1}} \left( \left( t_f i_j(v_k) - 2C_{j0}\sqrt{1 - \frac{v_k}{\phi}} - \left( t_f i_j(v_{k-1}) - 2C_{j0}\phi\sqrt{1 - \frac{v_{k-1}}{\phi}} \right) \right) \right) \quad (18)$$

and its derivative with respect to $v_k$. (19)

In this numerical integration algorithm customized implementation, ddt( ) function is expanded in the model, whereas before it was assumed to be handed by the simulator. As described earlier, this can improve speed somewhat by increasing the effectiveness of the cache.

It will be understood that the foregoing description and drawings of preferred embodiment in accordance with the present invention are merely illustrative of the principles of this invention, and that various modifications can be made by those skilled in the art without departing from the scope and spirit of the invention.

What is claimed is:

1. A method of compiling a model for use in a simulation of a system by a simulator that uses one or more models to represent one or more components of the system, the method comprising:
   receiving a hardware description language (HDL) description of the model;
   receiving a parameter value for at least one parameter within the description;
   automatically converting the HDL description into an implementation of the model;
   wherein converting includes inputting the received parameter value into the received model description;
   wherein the implementation of the model comprises one of an executable form of the model that includes the inputted parameter value targeted to a particular simulation engine or an intermediate representation of the model that includes the inputted parameter value and that is suited for re-targeting to multiple simulation engines; and
   saving the implementation of the model to a computer readable medium.

2. The method of claim 1, further including:
   wherein converting further includes pre-evaluating a portion of the model that is dependent upon the received parameter value.

3. The method of claim 1, further including:
   allocating parameter memory storage associated with the implementation, only for parameters that have not been inputted into the received description.

4. The method of claim 1,
   wherein the implementation comprises the intermediate representation of the model; and further including:
   converting the intermediate representation to executable code targeted to a prescribed simulator.

5. The method of claim 1,
   wherein converting further includes pre-evaluating an equation that includes the received model parameter value within the received description.

6. A computer-readable storage medium having executable instructions for causing a computer to perform a method of compiling a model for use in a simulation of a system by a simulator that uses one or more models to represent one or more components of the system, the method comprising:
   receiving a hardware description language (HDL) description of the model;
   receiving a model parameter value for at least one parameter within the description;
   automatically converting the HDL description into an implementation of the model;
   wherein converting includes inputting the received model parameter value into the received model description;
   wherein the implementation of the model comprises one of an executable form of the model that includes the inputted model parameter value targeted to a particular simulation engine or an intermediate representation of the model that includes the inputted model parameter value and that is suited for re-targeting to multiple simulation engines; and
   saving the implementation of the model to a computer readable medium.

7. The computer readable storage medium of claim 6:
   wherein converting further includes pre-evaluating a portion of the HDL description of the model that is dependent upon at least a portion of the received model parameter value.

8. The computer readable storage medium of claim 6,
   allocating parameter memory storage associated with the implementation, only for parameters that have not been inputted into the received description.

9. The computer readable storage medium of claim 6 further including executable instructions for causing a computer to perform a method further comprising:
   wherein converting further includes pre-evaluating an equation that includes the received model parameter value within the received description.

10. A method of compiling a model for use in a simulation of a system by a simulator that uses one or more models to represent one or more components of the system, the method comprising:
    receiving multiple different model parameter values for the at least one model parameter within the description;
    automatically converting the HDL description into multiple different implementations of the model, each implementation including a different received model parameter value for the at least one model parameter;
    wherein converting includes inputting a different received model parameter value into different instances of the received model description; and
    wherein each different implementation of the model comprises one of an executable form of the model that includes the model parameter value inputted into such implementation targeted to a particular simulation engine or an intermediate representation of the model that includes the model parameter value inputted into such implementation and that is suited for re-targeting to multiple simulation engines; and
    saving the multiple different implementations of the model to a computer readable medium.

* * * * *